US006917165B2

(12) United States Patent
Hopwood et al.

(10) Patent No.: US 6,917,165 B2
(45) Date of Patent: Jul. 12, 2005

(54) LOW POWER PLASMA GENERATOR

(75) Inventors: Jeffrey A. Hopwood, Needham, MA (US); Felipe Iza, Boston, MA (US)

(73) Assignee: Northeastern University, Boston, MA (US)

( * ) Notice: Subject to any disclaimer, the term of this patent is extended or adjusted under 35 U.S.C. 154(b) by 0 days.

(21) Appl. No.: 10/743,124

(22) Filed: Dec. 22, 2003

(65) Prior Publication Data

US 2004/0164682 A1 Aug. 26, 2004

Related U.S. Application Data

(60) Provisional application No. 60/436,982, filed on Dec. 30, 2002.

(51) Int. Cl.[7] ............................ H01J 7/24; C23C 16/00
(52) U.S. Cl. ............................ 315/111.21; 118/723 MP
(58) Field of Search ....................... 315/111.21, 111.71, 315/111.81, 111.91; 118/723 MP, 723 MW

(56) References Cited

U.S. PATENT DOCUMENTS

| | | | | |
|---|---|---|---|---|
| 5,070,277 A | | 12/1991 | Lapatovich | 315/248 |
| 5,942,855 A | | 8/1999 | Hopwood | 315/111.51 |
| 6,264,812 B1 | * | 7/2001 | Raaijmakers et al. | 204/298.06 |
| 6,297,595 B1 | * | 10/2001 | Stimson et al. | 315/111.51 |
| 6,660,134 B1 | * | 12/2003 | Gopalraja et al. | 204/192.12 |
| 6,759,808 B2 | * | 7/2004 | Grotjohn et al. | 315/111.71 |
| 2002/0170677 A1 | * | 11/2002 | Tucker et al. | 156/345.48 |
| 2003/0080685 A1 | | 5/2003 | Grotjohn et al. | 315/111.21 |

* cited by examiner

*Primary Examiner*—Hoang V. Nguyen
*Assistant Examiner*—Minh Dieu A
(74) *Attorney, Agent, or Firm*—Weingarten, Schurgin, Gagnebin & Lebovici LLP

(57) ABSTRACT

A low power plasma generator is provided which can be fabricated in micro-miniature size and which is capable of efficient portable operation. The plasma generator comprises a microwave stripline high Q resonant ring, which may be circular or non-circular, disposed on a dielectric substrate and having a discharge gap in the plane of the substrate. The resonant ring is one-half wavelength in circumference at the operating frequency and is matched to the impedance of the microwave power supply. The voltages at the resonator ends at the gap are 180° out of phase and create an intense electric field in the gap, and a resultant discharge across the gap. The discharge is non-thermal and operates near room temperature and has an intense optical emission. The generator is well suited for low power portable and other applications and can be readily fabricated by known microcircuit techniques. Alternatively, the gap of the resonant ring can extend through the substrate and in which the discharge is formed. A bias coil can be coupled to the ring to provide a bias voltage to the plasma. A feedback path can be provided for self oscillation and closed loop frequency control.

25 Claims, 6 Drawing Sheets

LOW POWER PLASMA GENERATOR

CROSS REFERENCE TO RELATED APPLICATIONS

Applicant claims the benefit under 35 U.S.C. § 119(e) of prior U.S. provisional application Ser. No. 60/436,982 filed Dec. 30, 2002, the disclosure of which is incorporated herein by reference.

STATEMENT REGARDING FEDERALLY SPONSORED RESEARCH OR DEVELOPMENT

This invention was made with government support. The U.S. Government has certain rights in this invention.

BACKGROUND OF THE INVENTION

There is a need for miniaturized plasma sources that can be integrated in portable or other devices for many applications such as bio-sterilization, small scale materials processing and microchemical analysis systems. Portable operation of microplasma sources places a limit on the amount of power and the vacuum levels that can be employed as well as on the maximum temperature the discharge can reach. For portable applications it is desirable to operate the discharge source at atmospheric pressure in order to eliminate the need for vacuum pumps. The temperature of the atmospheric discharge should remain low to prevent erosion and/or melting of the source. In view of the small dimensions of a miniaturized plasma source, even damage on the order of microns can become catastrophic and render the source inoperable in a short period of time.

A miniaturized inductively coupled plasma source is described in U.S. Pat. No. 5,942,855, assigned to the same Assignee as the present invention. This plasma source includes a substrate having an electrical circuit disposed thereon which includes a planar inductive coil and a capacitor coupled in series with the coil and a drive circuit coupled to the coil for driving the circuit at resonance. A plasma chamber is provided in proximity to the coil and containing a gas which is excited by energy from the coil. This source operates well but has a relatively low Q of the order of about 40, which results in lower power efficiency.

A microwave plasma source is the subject of an article entitled "A New Low-Power Microwave Plasma Source Using Microstrip Technology For Atomic Emission Spectrometry" A. M. Bilgic et al., Plasma Sources Sci. Technol 9 (2000)1–4, and an article entitled "A Low-Power 2.45 GHz Microwave Induced Helium Plasma Source At Atmospheric Pressure Based On Microstrip Technology" A. M. Bilgic et al. J. Anal. At. Spectrom. 2000, 15, 579–580. The plasma sources described in these articles create an electric field across a gap between a microstrip line on one side of a dielectric and a ground plane on the opposite side of the dielectric and wherein the gap is defined by the dielectric thickness of the device, which typically is in the range of 0.5–1 mm. The structure is not resonant and a relatively larger power input is required to initiate a plasma. In addition, the structure is susceptible to failure as ions are accelerated by a plasma sheath voltage that forms between the plasma and the microstrip line. As a result the microstrip electrode must be protected with a dielectric such as sapphire or glass. Ion erosion inherent in the design limits the usable lifetime of the device and wastes power, as power is expended in the ion erosion process rather than in the intended plasma generation.

A microwave plasma generator for a high pressure high intensity discharge lamp is disclosed in U.S. Pat. No. 5,070,277 which employ a microstrip transmission line on a low K dielectric material to drive helical coils on respective ends of a large capsule or lamp tube in which a hot plasma is formed. The device is relatively large and has a relatively large (several cm) discharge gap in which a large area hot discharge is formed. A gas mixture is sealed within the lamp tube and once heated reaches 1–10 atmospheres.

BRIEF SUMMARY OF THE INVENTION

In accordance with the invention a low power plasma generator is provided which can be fabricated in microminiature size and which is capable of efficient portable operation. The plasma generator comprises a microwave stripline high Q resonant ring, which may be circular or non-circular, disposed on a dielectric substrate and having a discharge gap in the plane of the substrate. The resonant ring is one-half wavelength in circumference at the operating frequency and is matched to the impedance of the microwave power supply. The voltages at the resonator ends at the gap are 180° out of phase and create an intense electric field in the gap, and a resultant discharge across the gap. The discharge is non-thermal and operates near room temperature and has an intense optical emission. The generator is well suited for low power portable and other applications and can be readily fabricated by known microcircuit techniques. Alternatively, the gap of the resonant ring can extend through the substrate in which the discharge is formed. A bias coil can be coupled to the ring to provide a bias voltage to the plasma. In one aspect, the invention can include a feedback path to provide self oscillation and closed loop frequency control.

BRIEF DESCRIPTION OF THE SEVERAL VIEWS OF THE DRAWINGS

The invention will be more fully described in the following detailed description and accompanying drawings in which.

DETAILED DESCRIPTION OF THE INVENTION

Figure 1:
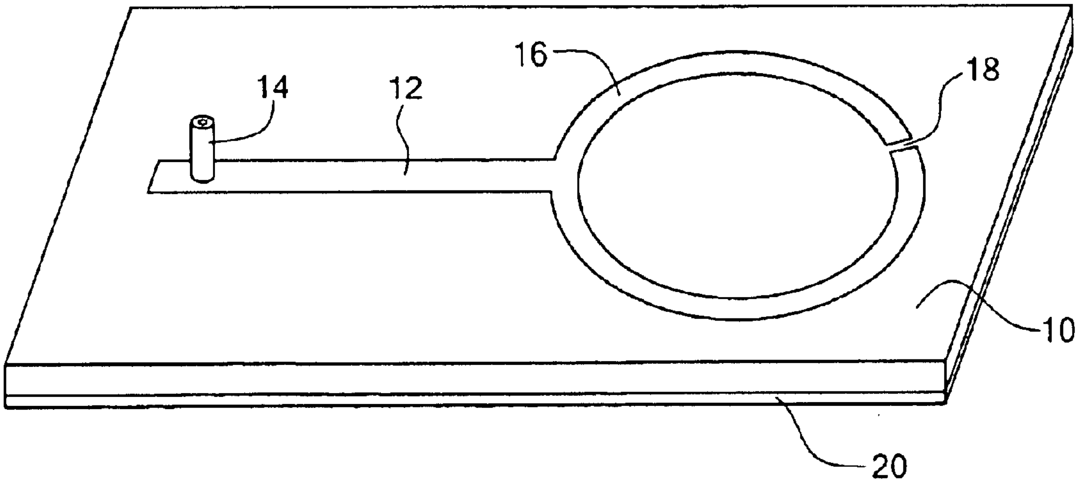
FIG. 1 is a pictorial view of one embodiment of a plasma generator according to the invention.

An embodiment of the invention is illustrated in FIG. 1. A substrate 10 of dielectric material has provided thereon a stripline 12 connected at one end to a coaxial connector 14 and at the other end to a high Q split ring resonator 16 having a gap 18 in the plane of the substrate. The stripline is one-quarter wavelength (λ/4) in length at the operating frequency and serves as a quarter wave transformer to match the ring resonator impedance to the impedance of a power supply which energizes the generator. The impedance is typically 50 ohms. The circumference of the ring resonator is one-half wavelength (λ/2) at the operating frequency. The angle between the discharge gap and the centerline of the ring is such that the impedance measured at the power input at connector 14 is matched to that of the power supply. A ground plane 20 is provided on the opposite side of the substrate 10 from the resonant ring. The voltages at the resonator ends at the gap 18 are 180° out of phase, and in combination with the resonance of the ring create an intense electric field in the gap, and a resulting discharge across the gap. The dielectric material is a material of high dielectric constant, an example being RT/Duroid 6010.8 which is a ceramic-reinforced Teflon having a dielectric constant of 10.8 and a copper coating on each side. The dielectric material in one implementation is 635 μm thick and the copper thickness is 9 μm. The microstrip pattern is formed in one of the copper surfaces by photo-lithographic and wet etching techniques which themselves are known in the art. Other processing techniques can be used to form the microstrip pattern. The unetched copper coating serves as the ground plane 20.

The term "ring" is not to be limited to only a circular ring but is intended to refer to any circular or non-circular shaped resonator which can include for example circular, elliptical or oval and other non-circular rings, and rectangular or other multisided shapes. Preferably the resonator ring has a circular or other curved shape.

The generator can be of small size and compact construction to be integrated into associated equipment and to be easily transportable for field use or for other portable applications. In the embodiment of FIG. 1 for example, the overall length of the generator is about 5 cm, the stripline width is 2.9 mm, and the resonator ring has an outside diameter of 10.5 mm. The discharge gap is 500 μm in length and is angularly disposed 7.2° from the centerline of the device. The gap can vary in size over a relatively broad range. The gap can be as small as about 1 μm to about 2 mm or more.

Figure 2:
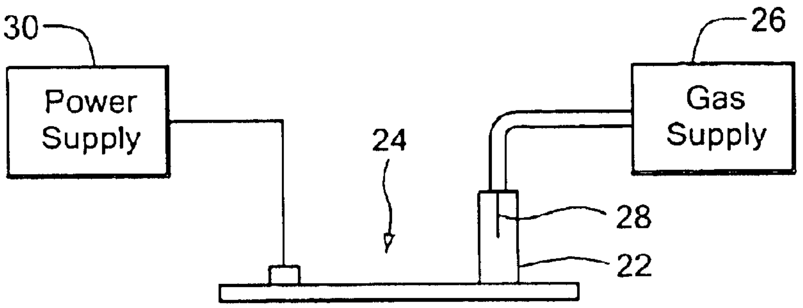
FIG. 2 is a diagrammatic view of the embodiment of FIG. 1 showing connection to a power supply and gas supply.

The connector 14 is typically a subminiature type A (SMA) coaxial connector attached at right angles to the stripline and used to couple power to the device. The power supply 30 (FIG. 2) is, for example, a three watt linear RF amplifier, having a frequency source and an amplifier, operating at a frequency of 904.5 MHz. The power supply can be a separate device connected to the resonator or can be mounted on the same substrate as the resonator. The power supply can alternatively be an integrated circuit supply which is connected directly to the resonator without need for a connector, as will be described below in relation to FIG. 11.

A chamber or tube is provided over the discharge gap to provide an intended gas environment in which the discharge is to occur. In the embodiment illustrated in FIG. 2, a glass tube 22 is bonded over the gap region of the generator 24 such as by an epoxy adhesive. The other end of the tube 22 is coupled to a gas supply 26 which provides a flow of gas to the tube. The gas can typically be high purity argon or air. A sensor 28 can be provided in tube 22 to sense gas pressure and/or flow for use in control of the gas environment in the tube. The gas environment can be dynamic or static. For a dynamic environment the gas is caused to flow through the chamber or tube in which the discharge gap is located. For static operation, gas can be sealed in the chamber or tube. For some purposes the discharge can occur in open air without a chamber enclosing the gap.

The plasma generator is operative with many different gasses including environmental air or purified air. In addition to argon and air discussed above, other inert gasses can be employed such as helium and nitrogen or other gasses commonly used in industrial processes where the novel plasma generator may be utilized. For use of the generator in a light source, the gas could be for example, xenon, mercury vapor or sodium vapor.

Figure 3:
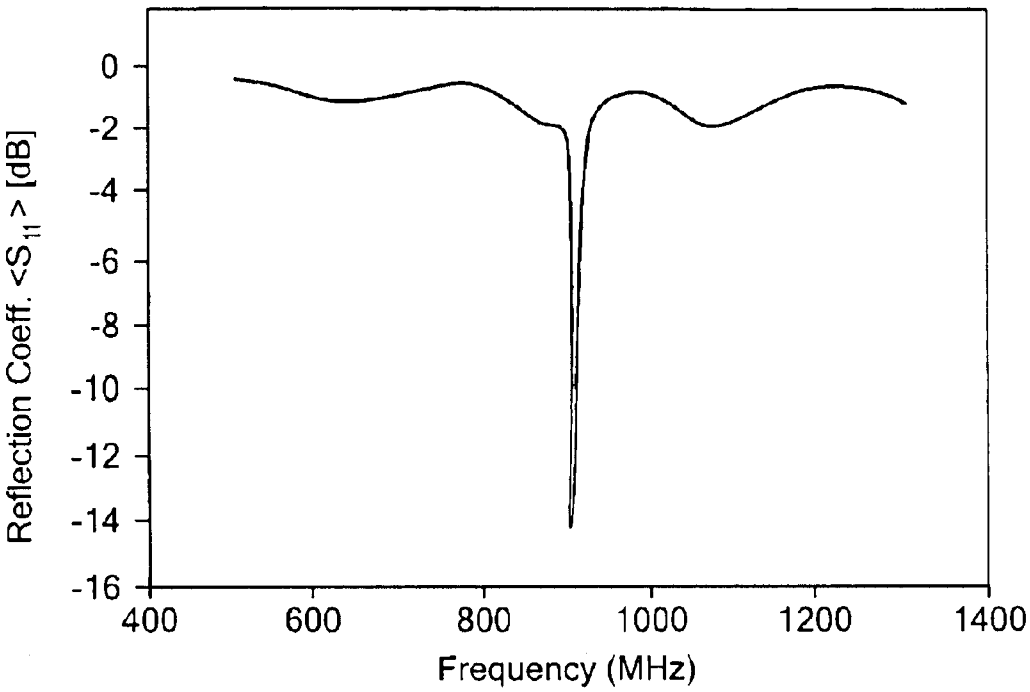
FIG. 3 is a plot of reflection coefficient vs. frequency for the embodiment of FIG. 1.

When the generator is energized, an intense electric field is created in the region of the resonator gap due to the high Q or quality factor of the ring resonator. The high Q connotes very low power loss in the resonator through resistive heating and radiative effects. The reflection coefficient ($S_{11}$) as a function of frequency is shown in FIG. 3. From the reflection coefficient, the Q of the resonator can be obtained from the following equation:

$$Q=f_c/\Delta f_{3db}=(904.5\text{ MHz})/(905.9-903.2\text{ MHz})=335$$

Where $f_c$ is the resonant frequency and $\Delta f_{3db}$ is the bandwidth where the reflection coefficient increases by 3 db from its value at resonance. The Q of the microstripline resonator of the present invention is about an order of magnitude higher than that of an inductor type plasma source such as described in the '855 patent noted above. The high Q provides a high voltage to initiate and sustain the discharge and provides efficient power transfer to sustain the plasma.

The maximum voltage difference occurs across the gap and the electric field is concentrated in the gap and is at least double the magnitude of the electric field in the stripline, which favors discharge breakdown in the gap and minimization of losses in the stripline structure. The electric field confined to the gap reduces radiation losses and interference with other electronic equipment. Reducing the gap length with respect to the dielectric thickness can increase the field strength in the gap but at an increase in capacitive coupling between the ends of the resonator and a shift in the resonant frequency of the device. The stripline dimensions and gap length are determined in the design of specific embodiments to achieve the intended resonant frequency and performance characteristics.

Figure 4:
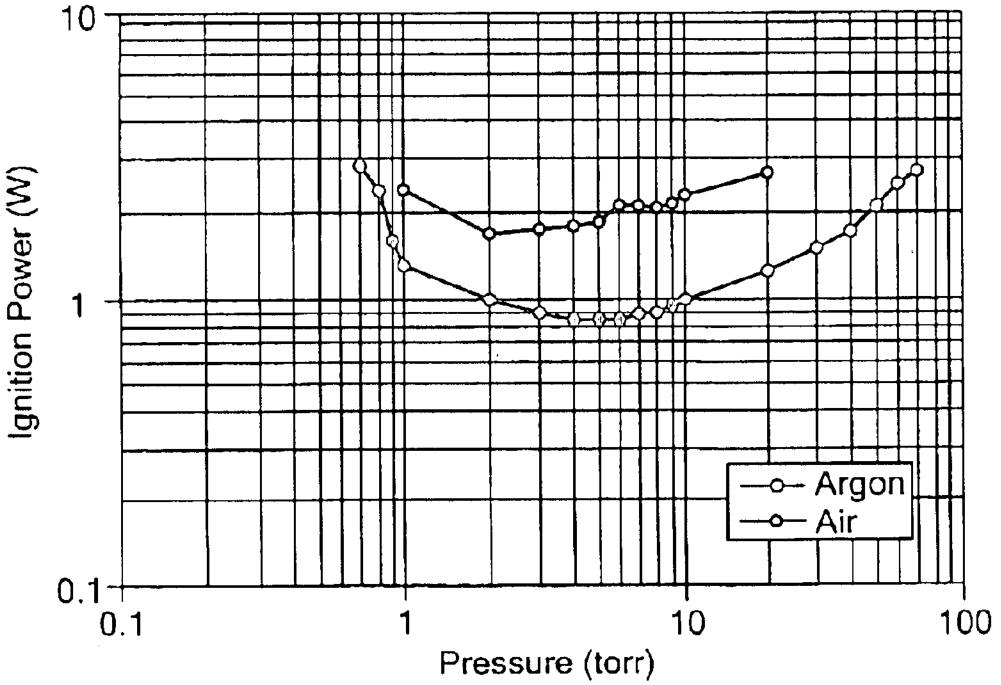
FIG. 4 is a plot of ignition power vs. pressure for argon and air for the embodiment of FIG. 1.

The plasma generator is operative at low power to produce a discharge across the gap over a relatively wide range of gas pressure. FIG. 4 shows the power required to ignite argon and air discharges as a function of gas pressure for the embodiment of FIG. 1. Breakdown of argon occurs between 0.7 torr and 70 torr with a power input of 3 watts (W). Air due to its molecular nature requires additional power relative to argon, but breakdown is induced between 1 and 20 torr at the same 3 watt power level. A discharge in argon can be ignited with 850 mW of power at 5 torr. An air discharge can be ignited at 1.7 W at 2 torr. Thus, very low power is needed to ignite and sustain the discharge. During operation, the plasma source remains relatively cool, typically less than 40° C. and little if any erosion of the gap material occurs. As a consequence the plasma source has a relatively long useful lifetime.

Figure 5:
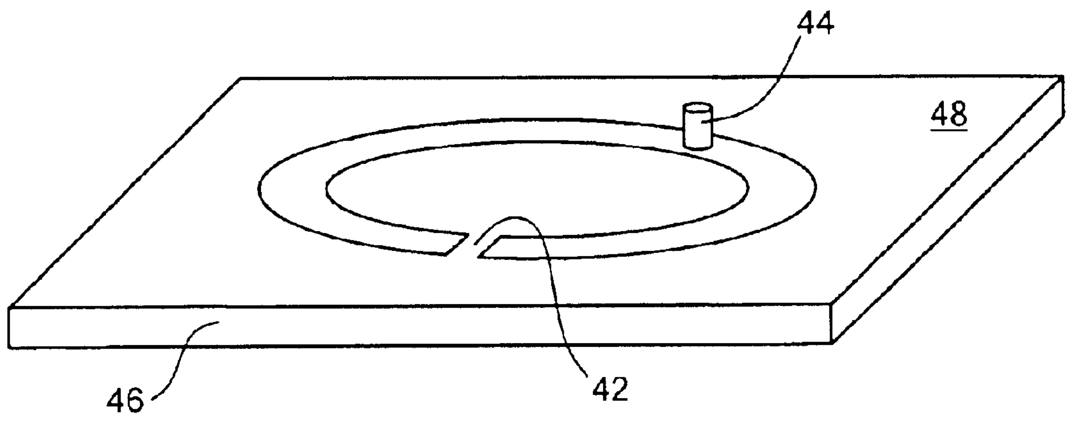
FIG. 5 is a pictorial view of another embodiment of a plasma generator according to the invention.
Figure 6:
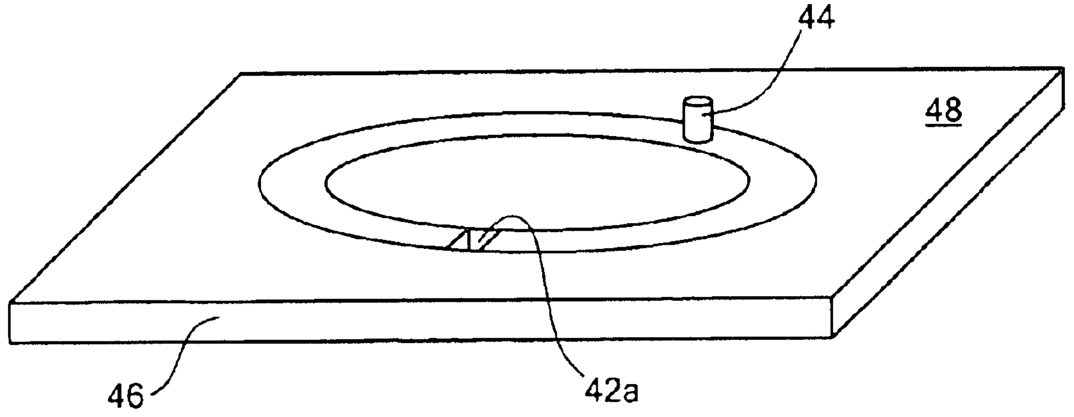
FIG. 6 is a pictorial view of an alternative embodiment similar to that of FIG. 5 and having a discharge gap extending through the substrate.

In another embodiment of the invention, the λ/4 transmission line is eliminated and impedance matching of the resonant ring is accomplished by the dimensions of the ring and the position of the input connector and discharge gap on the ring. Such an embodiment is illustrated in FIG. 5 wherein a split ring resonator 40 has a gap 42 between confronting ends of the stripline, and an input connector 44 on the stripline. The gap in this embodiment is typically 50 μm. The connector 44 and gap 42 are in positions on the ring resonator 40 to provide an impedance matched to that of the power supply, typically 50 ohms. No matching networks or elements are required as in known plasma sources and as a result, the present generator can be very compact without sacrificing performance. The gap in the embodiment of FIG. 5 is in the plane of the substrate as in the embodiment of FIG. 1. Alternatively, as shown in FIG. 6, the gap 42*a* can extend through the substrate. A ground plane 46 is on the opposite side of substrate 48 in either embodiment.

Figure 7:
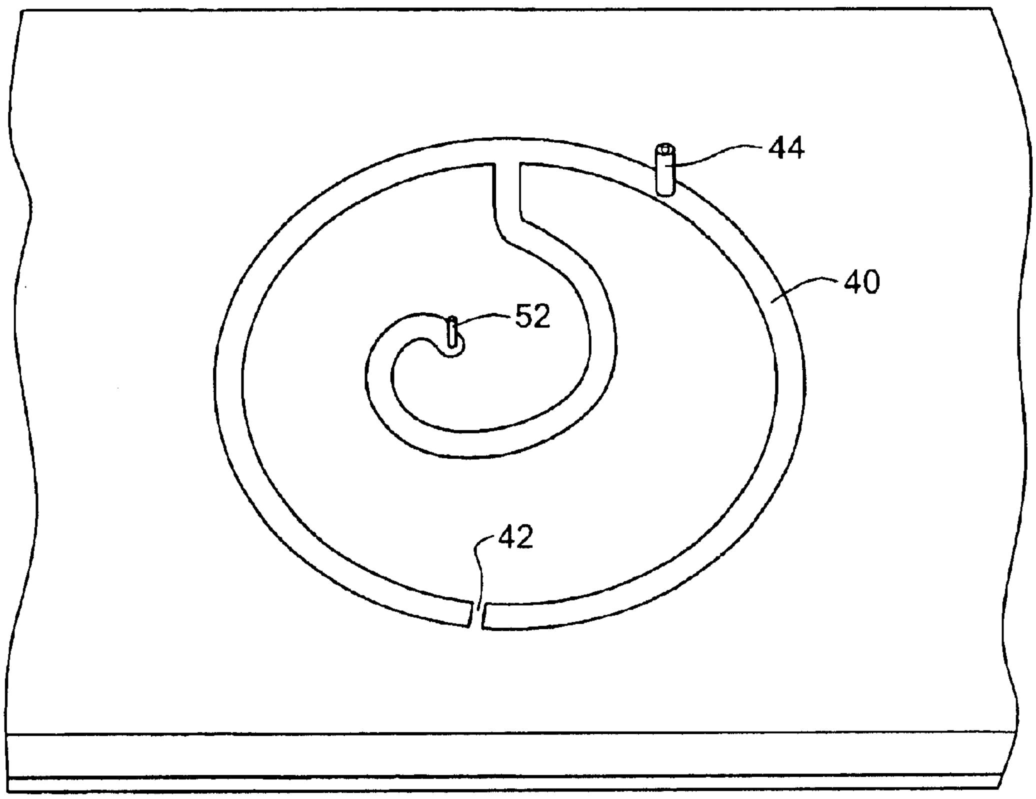
FIG. 7 is a plan view of another embodiment of the invention having a bias coil.

A further embodiment is shown in FIG. 7 which is similar to that of FIG. 5 and wherein the ring resonator 40 has a bias coil 50 connected between a region of the microstripline and an electrical connector 52 which is connectable to a bias source. The length of the bias coil 50 is λ/4 such that the bias source does not affect the operation of the resonator 40. The bias voltage permits the user to externally control the average voltage of the plasma. This technique is useful for extraction of ions from the plasma. The bias voltage may typically be up to about ±500V and can be a DC voltage or can be an RF voltage having a frequency up to about 100 MHz. The bias voltage is applied to the end of coil 50 and the ground plane.

Figure 8:
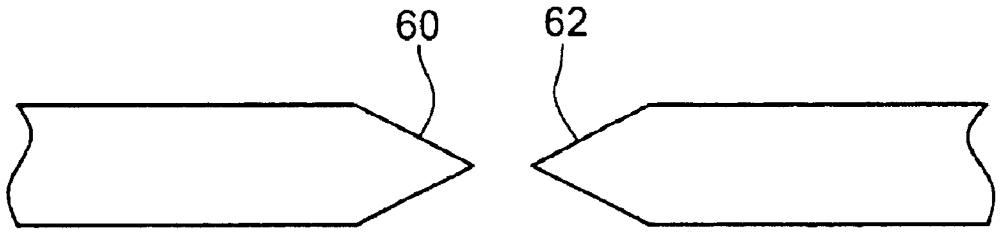
FIG. 8 is a cutaway plan view of a discharge gap having triangular shaped ends.
Figure 9:
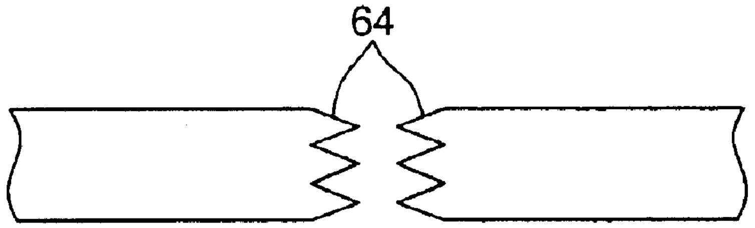
FIG. 9 is a cutaway plan view of a discharge gap having multiple pointed ends.
Figure 10:
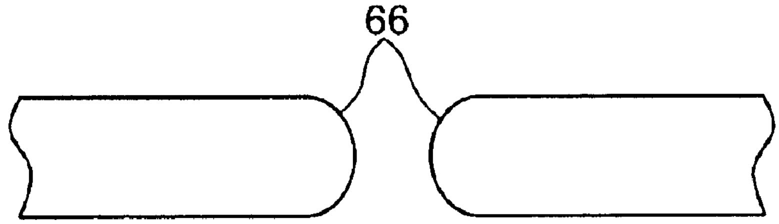
FIG. 10 is a cutaway plan view of a discharge gap having rounded confronting ends.

The discharge gap can be shaped to provide intended discharge performance or characteristics. A further embodiment is illustrated in FIG. 8 in which the confronting ends 60 and 62 of the microstrip defining the discharge gap are of triangular shape. The gap is defined by the points of the confronting triangular ends which are approximately 50 μm in width. The plasma forms at the narrowest point of the gap; that is, between the triangular points and since the plasma is smaller, less power is required to maintain it. The power to maintain a plasma discharge with the pointed gap is about 0.1 W at 1 atmosphere of argon. The triangular shaped gap is also of benefit to fix the position of the plasma discharge as the discharge tends to remain between the confronting triangular tips. In the uniform gap of the embodiments described above, the plasma can drift along the width of the microstrip ends defining the gap. The gap can be shaped otherwise to provide particular discharge characteristics. For example, the gap can be defined by multiple pointed ends 64 as shown in FIG. 9, or rounded ends 66 as in FIG. 10.

Figure 11:
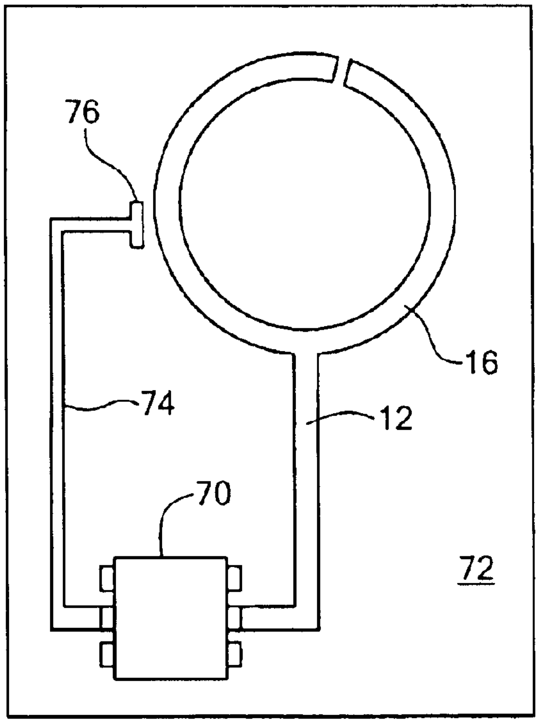
FIG. 11 is a plan view of an alternative embodiment having a feedback loop and a power source on a common substrate.

An embodiment is illustrated in FIG. 11 which includes a ring resonator 16 and quarter-wave stripline 12, as in FIG. 1. An integrated circuit power amplifier 70 is mounted on a common substrate 72 with the resonator. The output of amplifier 70 is connected directly to the outer end of stripline 12 without need for a separate connector as in FIG. 1. The amplifier is in one implementation an 850 MHz, 1.5 W, 3V cell phone amplifier. A stripline 74 extends between an input of amplifier 70 and an end 76 which confronts the resonator 16, and serves as a feedback path having a capacitive pickup provided by end 76. The feedback path is of an effective length to provide a 180° phase shift between its input and output, such that self oscillation will occur without a separate oscillator in the power source. The feedback path also serves to control the driving frequency.

Figure 12:
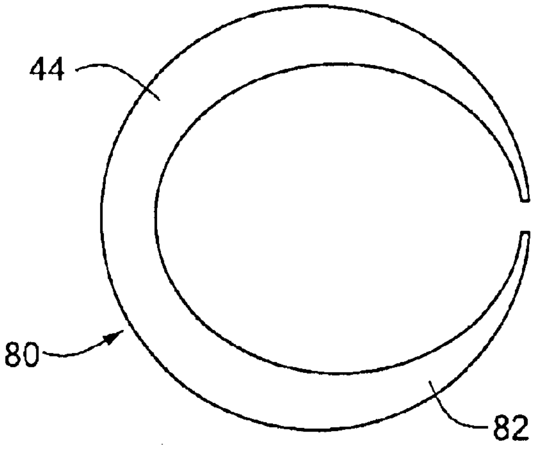
FIG. 12 is a plan view of a further embodiment having a crescent shaped split ring.

A further embodiment is shown in FIG. 12 in which a split ring resonator 80 has tapering portions 82 which are of crescent shape. The microstrip line narrows near the gap and has a higher characteristic impedance that better matches that of the discharge. This configuration is particularly suitable for high resistance plasmas.

The present invention may be utilized in a number of application. These applications include gas sensors in which the optical emission from atoms and molecules is sensed by a spectrometer. From the wavelength and intensity of photon emission from the plasma, the quantity and type of gas constituents may be determined. The present invention may also be used as an ionizer in which the atoms and molecules in a gas stream are ionized and then identified by a mass spectrometer or ion mobility spectrometer. The microplasma may also be used a source of chemically reactive gas. For example, the plasma excitation of air creates molecular radicals that are well-known to render non-infectious many biological organisms such as bacteria. The radicals from this microplasma may also be used to remediate toxic chemical substances such as chemical weapons and industrial waste products. In addition to plasma cleaning applications, the microplasma may be part of a miniature chemical production system in which gas flows of reactant species are directed through the microplasma where the chemicals react in a controlled manner to produce a useful chemical product. This type of miniature chemical process system would allow for portable, point-of-use production of volatile, short-lived, or dangerous chemicals. Finally, the microplasma is useful as a source of light in the visible, ultraviolet, and the vacuum ultraviolet parts of the spectrum. In all of these applications, a number of microplasma sources may be combined to cover a linear region or an extended area.

The invention is not to be limited by what has been particularly shown and described. The plasma generator according to the invention can be fabricated in various sizes and configurations to suit particular requirements and operating frequencies. In addition, the plasma generator can be fabricated by various known techniques including MEMS, printed circuit and microcircuit techniques. The generator can also be fabricated in a manner compatible with integrated circuit and other electronics. Accordingly, the invention is intended to encompass the spirit and full scope of the appended claims.

What is claimed is:

1. A plasma generator comprising:

a substrate having a first surface and a second surface;

a high Q stripline resonant ring disposed on the first surface of the substrate, the stripline ring having a perimeter of λ/2 at an operating frequency, and having a discharge gap;

the stripline resonant ring having an impedance matched to that of a power source which provides microwave power to the ring;

a ground plane disposed on the second surface of the substrate;

a connector for connection to a power source for applying microwave power to the stripline ring; and an enclosure attached to the first surface of the substrate at least over the region containing the discharge gap for containing a gas in the region of the gap.

2. The plasma generator of claim 1 wherein the resonant ring is circular.

3. The plasma generator of claim 1 wherein the resonant ring is non-circular.

4. The plasma generator of claim 1 including a λ/4 transmission line between the connector and the ring.

5. The plasma generator of claim 1 wherein the substrate is a planar substrate having a high dielectric constant.

6. The plasma generator of claim 1 wherein the connector and the gap are disposed in positions on the resonant ring to provide an intended impedance matched to that of the power source.

7. The plasma generator of claim 1 wherein the gap has a length of 500 μm.

8. The plasma generator of claim 1 wherein the gap has a length of 50 μm.

9. The plasma generator of claim 1 wherein the gap has a length in a range of about 1 μm to about 2 mm.

10. The plasma generator of claim 1 wherein the enclosure is a tube coupled to a gas source.

11. The plasma generator of claim 10 wherein the gas source provides argon to the tube.

12. The plasma generator of claim 10 wherein the gas source provides air to the tube.

13. The plasma generator of claim 1 wherein the discharge gap is in the plane of the resonant ring.

14. The plasma generator of claim 1 wherein the discharge gap extends through the substrate.

15. The plasma generator of claim 1 including a bias coil having one end coupled to the resonant ring and the other end having a connector for application of a bias voltage.

16. The plasma generator of claim 1 wherein the enclosure has a gas sealed therein.

17. A plasma generator comprising:

a substrate having a first surface and a second surface;

a high Q stripline resonant ring disposed on the first surface of the substrate, the stripline ring having a perimeter of λ/2 at an operating frequency, and having a discharge gap;

the stripline resonant ring having an impedance matched to that of a power source which provides microwave power to the ring;

a ground plane disposed on the second surface of the substrate; and a connector for connection to a power source for applying microwave power to the stripline ring.

18. The plasma generator of claim 17 wherein the resonant ring is circular.

19. The plasma generator of claim 17 wherein the resonant ring is non-circular.

20. The plasma generator of claim 17 wherein the power source is on the substrate.

21. The plasma generator of claim 17 wherein the resonant ring is of crescent shape near the discharge gap.

22. The plasma generator of claim 17 wherein the resonant ring has a stripline width which decreases toward the discharge gap.

23. A plasma generator comprising:

a substrate having a first surface and a second surface;

a high Q stripline resonant ring disposed on the first surface of the substrate, the stripline ring having a perimeter of λ/2 at an operating frequency, and having a discharge gap;

the stripline resonant ring having an impedance matched to that of a power source which provides microwave power to the ring;

a ground plane disposed on the second surface of the substrate; and a power source on the substrate coupled to the resonant ring.

24. The plasma generator of claim 23 wherein the power source is an integrated circuit power amplifier.

25. The plasma generator of claim 24 including a feedback path between the resonant ring and an input of the power amplifier to provide oscillation and frequency control of the power amplifier.

* * * * *